(12) United States Patent
Song (10) Patent No.: US 7,324,621 B2
(45) Date of Patent: Jan. 29, 2008

(54) LOCKED LOOP CIRCUIT

(75) Inventor: Hongjiang Song, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 812 days.

(21) Appl. No.: 09/821,649

(22) Filed: Mar. 29, 2001

(65) Prior Publication Data

US 2002/0141527 A1    Oct. 3, 2002

(51) Int. Cl.
    *H03D 3/24*    (2006.01)
(52) U.S. Cl. ...................................... 375/376
(58) Field of Classification Search ................ 375/376, 375/354; 327/158; 713/322
    See application file for complete search history.

(56) References Cited

U.S. PATENT DOCUMENTS

| | | | | |
|---|---|---|---|---|
| 5,353,025 A * | 10/1994 | Leonida | ........................ | 341/122 |
| 5,614,868 A * | 3/1997 | Nielson | ........................ | 331/1 A |
| 5,623,644 A * | 4/1997 | Self et al. | ........................ | 713/503 |
| 5,815,539 A * | 9/1998 | Lennen | ........................ | 375/371 |
| 6,141,332 A * | 10/2000 | Lavean | ........................ | 370/335 |
| 6,282,253 B1 * | 8/2001 | Fahrenbruch | ........................ | 375/371 |
| 6,456,676 B1 * | 9/2002 | O'Connor et al. | ........................ | 375/354 |
| 6,477,658 B1 * | 11/2002 | Pang | ........................ | 713/501 |
| 6,532,255 B1 * | 3/2003 | Gunzelmann et al. | ........................ | 375/150 |
| 6,535,989 B1 * | 3/2003 | Dvorak et al. | ........................ | 713/500 |
| 2002/0130691 A1 * | 9/2002 | Silvestri | ........................ | 327/158 |

\* cited by examiner

*Primary Examiner*—David C. Payne
*Assistant Examiner*—Nader Bolourchi
(74) *Attorney, Agent, or Firm*—Trop, Pruner & Hu, P.C.

(57) ABSTRACT

A system includes a locked loop circuit and a processor. The processor is coupled to the locked loop circuit to control the locked loop circuit and perform at least one other function in the system not related to the control of the locked loop circuit.

23 Claims, 6 Drawing Sheets

LOCKED LOOP CIRCUIT

BACKGROUND

The invention generally relates to a locked loop circuit, such as a delay locked loop circuit, for example.

For purposes of synchronizing operations of a particular circuit device with a system clock signal, the device may use a phase locked loop (PLL) circuit or a delay locked loop (DLL) circuit, a circuit that receives the system clock signal and generates a local clock signal that is synchronized to the system clock signal. Conventional PLL and DLL circuits consume significant die area and thus, as high performance semiconductor devices (central processing units (CPUs) and dynamic random access memory (DRAM) devices, for example) become increasingly more dense, challenges exist in placing the PLL and DLL circuits in these high performance devices. Furthermore, a digital system, such as a computer system, may have a large number of the PLL and DLL devices, thereby occupying a significant amount of die area in the overall system. For example, in a computer system, a CPU operates in synchronization with various other system devices, and therefore, synchronized clock signals must be generated inside the CPU, as well as inside the various devices that interact with the CPU.

PLL and DLL circuits have the capability of locking the phase of a generated clock signal to the phase of a given reference clock signal relatively independent of temperature, supply and manufacturing process variations. Therefore, these circuits have been the most popular solutions to synchronization problems. However, as noted above, these circuits may consume a significant amount of die area in a particular digital system. Furthermore, because the timing of the locked loop circuit is highly coupled to the process technology that is used to fabricate the locked loop circuit, the design of high performance locked loop circuits is a difficult task, thereby requiring significant design time.

Thus, there is a continuing need for an arrangement that addresses one or more of the problems that are stated above.

DETAILED DESCRIPTION

Figure 1:
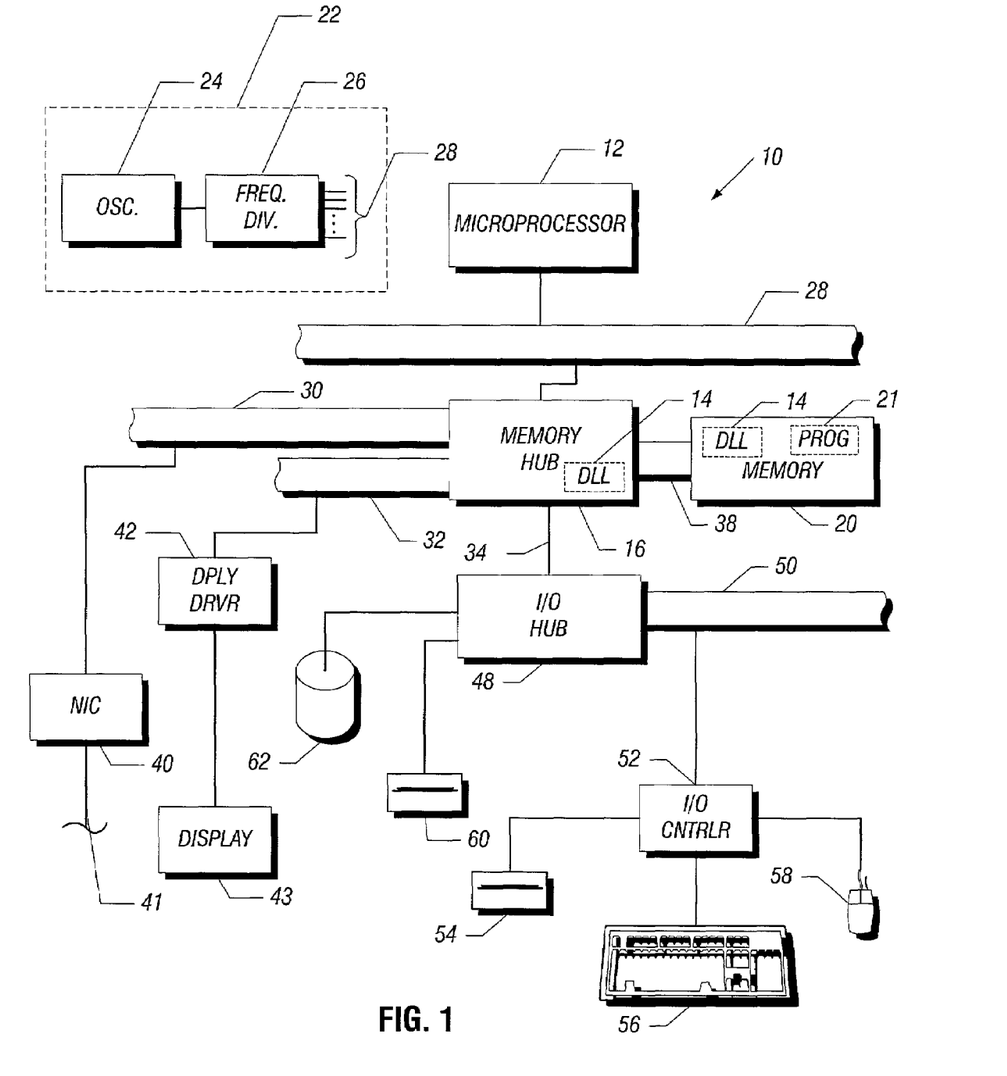
FIG. 1 is a schematic diagram of a computer system according to an embodiment of the invention.

Referring to FIG. 1, an embodiment 10 of a computer system in accordance with the invention includes a microprocessor 12, a device that may form a central processing unit (CPU) for the computer system 10. The microprocessor 12 interacts with many components of the computer system 10, such as a north bridge, or memory hub 16, and a memory 20 that forms at least part of the overall system memory for the computer system 10. Devices of the computer system 10, such as the microprocessor 12, as well as the memory hub 16 and memory 20, are synchronized to various system clock signals of the system, and these system clock signals may be generated by a clock generation circuit 22, for example.

For purposes of synchronizing the operations of the memory hub 16 and the memory 20 with these system clock signals, the memory hub 16 and the memory 20 may each include at least one delay locked loop (DLL) circuit 14, a circuit that receives a system clock signal from the clock generation circuit 22 and synchronizes a local clock signal (generated by the DLL circuit 14) to the received system clock signal for purposes of synchronizing operations of the corresponding device 16, 20. The DLL circuit 14, in some embodiments of the invention, is software controlled, an arrangement that allows the DLL circuit 14 to occupy relatively little die area, as compared to conventional DLL circuits. Thus, the DLL circuit 14 allows higher density device integration.

Although the memory hub 16 and the system memory 20 are depicted with DLL circuits 14, it is understood that many other devices (the microprocessor 12, an I/O hub 48, etc.) of the computer system 10 are also synchronized to system clock signals and may use an associated DLL circuit 14, as described below.

More particularly, in some embodiments of invention, the DLL circuit 14 is both a hardware and software-oriented device that is controlled in part by the microprocessor 12. The ability to be controlled by the microprocessor 12 through the microprocessor's execution of software reduces the overall size and complexity of the DLL 14, thereby enhancing integration of the various DLL circuit 14 into the computer system 10.

As described in more detail below, in some embodiments of the invention, the DLL circuit 14 includes an interface for indicating a phase difference between a system clock signal (i.e., the signal that the DLL circuit 14 locks onto) received by the DLL circuit 14 and a clock signal generated by the DLL circuit 14 in response to this received system clock signal. In this manner, the microprocessor 12 may read an indication of this phase difference from a register of the interface of the DLL circuit 14 and regulate a delay of the DLL circuit 14 by writing a delay value to another register of the interface. Thus, the DLL circuit 14 is a "soft" DLL architecture, which minimizes the hardware used to implement the DLL circuit 14, as the loop control of the DLL circuit 14 may be fully implemented in the software domain in some embodiments of the invention, as described below.

Figure 2:
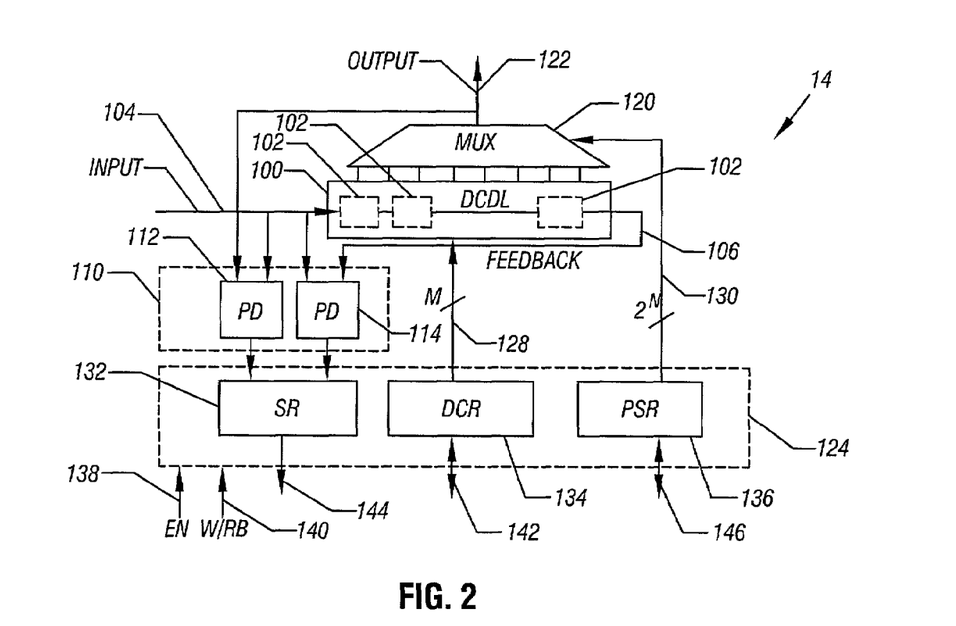
FIG. 2 is a schematic diagram of a delay locked loop circuit according to an embodiment of the invention.

Referring to FIG. 2, in some embodiments of the invention, the DLL circuit 14 may include a digitally controlled delay line 100, phase detection circuitry 110, a software-accessible DLL control and status interface 124 and multiplexing circuitry 120 to select one of multiple output clock signals (the selected output clock signal appearing at an output terminal 122 of the multiplexing circuitry 120) that are generated by the DLL circuit. Each of these multiple clock signals has a different phase with respect to the system clock signal (hereinafter called an "input clock signal") that is received by the DLL circuit 14.

In some embodiments of the invention, the delay line 100 includes $2^N$ (where "N" is an integer) identical delay buffer stages 102 that are serially coupled together to generate these output clock signals at the output terminals of the buffer stages 102. Due to this arrangement, a register 134 of the interface 124 may be used to control the delay of the delay line 100. More particularly, the register 134 is writeable (via communication lines 142) by the microprocessor 12 with an M bit value that indicates the same delay for each of the delay buffer stages 102, and thus, may be written to by the microprocessor 12 to control the delay between the input clock signal and the selected output clock signal.

An output terminal 106 of the last buffer stage 102 of the delay line 100 provides a signal (called "feedback") that is processed by the phase detection circuitry 110, as described below.

The phase detection circuitry 110 includes at least two phase detectors 112 and 114, according to some embodiments of the invention. More particularly, the phase detector 112 detects the phase difference between the output clock signal that is present at the output terminal 122 of the multiplexing circuitry 120 (and thus, is selected by the multiplexing circuit 120) and an input clock signal (the received system clock signal) that is present on an input terminal 104 of the delay line 100. The phase detector 114 indicates a phase difference between the feedback clock signal (present at the output terminal 106 of the delay line 100) and the input clock signal. The output terminals of the phase detectors 112 and 114 set the values (called $SR_1$ and $SR_0$, respectively) of corresponding bits in a status register 132 (readable by the microprocessor 12 via communication lines 144) of the interface 124.

Thus, in this manner, the microprocessor 12 may read the status register 132 to determine a particular phase relationship between a the output/feedback clock signal and the input clock signal. The phase relationship may be, for example, the status of whether the output clock signal is leading or lagging the input clock signal. For example, the $SR_1$ bit of the status register 132 may be set to "0" to indicate that the output clock signal on the terminal 122 is leading the input clock signal and may be set to "1" to indicate that the output clock signal is lagging the input clock signal.

Among the other features DLL circuit 14, the DLL circuit 14, may include a selection register 136 that is part of the interface 124 and is writeable via communication lines 116 by the microprocessor 12 with a value to control the multiplexing circuitry 120 to select the particular output clock signal that appears at the output terminal 122. Thus, once synchronization has been achieved (as described below) the value stored in the register 136 controls the phase difference between this output clock signal and the input clock signal. Indications of the bits of the selection register 136 are provided to the multiplexing circuitry 120 via $2^N$ selection lines 130 that are coupled between the register 136 and the multiplexing circuitry 120.

The DLL circuit 14 may also include various other input and output terminals, such as, for example, an enable terminal 138 to selectively enable the DLL circuit 14 and a write/read strobe signal terminal 140 to control whether the microprocessor 12 is to write or read from the interface 124. Also, the DLL circuit 14 may include communication lines 128 to communicate indications of the M bits of the register 134 to the delay line 100 to set the delay of the delay line 100. As an example, the registers 132, 134 and 136 of the interface 124 may be mapped into a range of addresses to place these registers in the system memory of the computer system 10 to permit the microprocessor 12 to use memory accesses to communicate with the interface 124. Other arrangements are possible.

Figure 3:
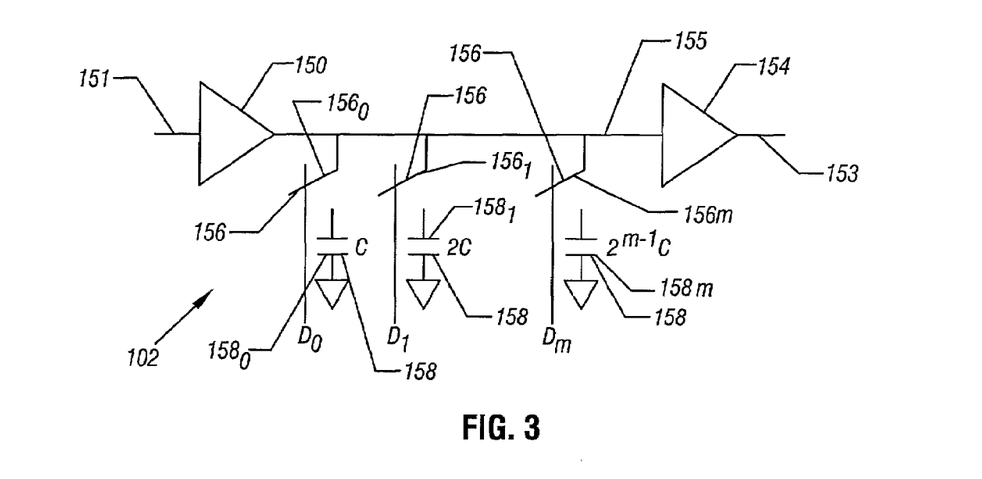
FIG. 3 is a schematic diagram of a buffer stage of a delay line of the delay locked loop circuit of FIG. 2 according to an embodiment of the invention.

Referring to FIG. 3, in some embodiments of the invention, the delay buffer stage 102 may include an input buffer 150, an output buffer 154 and various capacitive elements that are located between the input buffer 150 and the output buffer 154. In this manner, the input buffer 150 includes an input terminal 151 that receives either the input clock signal (from the input terminal 104 for the first stage 102 of the delay line 100) or is coupled to an output terminal 153 of the output buffer 154 from the previous stage 120 (for all other stages 102). To establish the delay, the buffer stage 102 includes capacitors 158 (capacitor $158_0$, $158_1$, ... $158_m$, depicted as examples) that are binarily weighted to establish the delay indicated by the bits of the register 134. In this manner, based on the values of these bits, corresponding switches 156 (switches $156_0$, $156_1$ ... $156_m$, as examples) selectively couple the capacitors 158 to a node 155 shared in common between the output terminal of the buffer 150 and the input terminal of the buffer 154 to establish the appropriate delay of the stage 102.

For example, the least significant bit (represented by a signal called $D_0$) of the register 134 controls whether the capacitor $158_0$ that has a capacitance of "C" is to be connected to the node 155. In this manner, if this bit is set to "1," for example, then the corresponding switch $156_0$ is closed to connect the capacitor $158_0$ to the node 155. Likewise, if the most significant bit (represented by a signal called $D_m$) of the register 134 is set to "1," then the switch $156_m$ is closed to couple a capacitance of $2^{M-1} \cdot C$ to the node 155. A bit indicative of "0" causes the corresponding switch 156 to be opened, thereby not coupling the associated capacitor 158 to the node 155.

Figure 4:
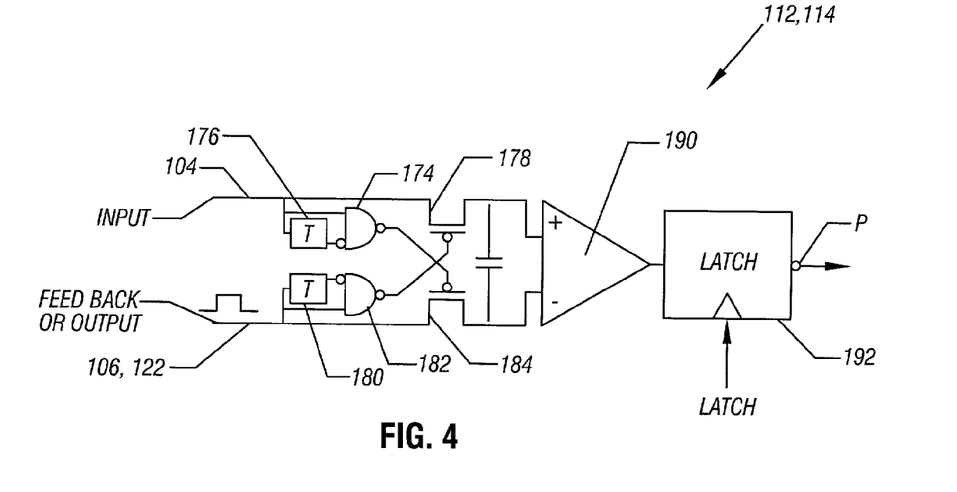
FIG. 4 is a schematic diagram of a phase detector of the delay locked loop circuit of FIG. 2 according to an embodiment of the invention.

FIG. 4 depicts an exemplary embodiment of the phase detector 112, 114. The phase detector 112, 114 is based on a cross-sampling scheme to extract the binary phase relationship (leading or lagging) of the selected (by the multiplexing circuitry 120) output clock signal with the clock signal present on the input terminal 104.

More particularly, in some embodiments of the invention, the phase detector 112, 114 includes a NAND gate 174 that has one noninverted input terminal that is coupled to the input terminal 104. An inverted input terminal of the NAND gate 174 is coupled through a delay element 176 to the input terminal 104. Thus, due to this arrangement, the negative going edge of the input clock signal initiates a brief sampling interval to sample the output clock signal, as described below. During this sampling interval, the NAND gate 174 momentarily de-asserts (drives low, for example) the signal at its output terminal to cause sampling of the output clock signal.

Likewise, a NAND gate 182 of the phase detector 112, 114 has an inverted input terminal coupled via a delay element 180 to the input terminal 104 and its other noninverted input terminal coupled directly to the terminal 122 (for the phase detector 112 or the terminal 106 (for the phase detector 114). The output terminal of the NAND gate 182 provides a signal that is de-asserted (driven low, for example) beginning on the negative going edge of the output clock signal to cause sampling of the input clock signal.

The sampling of the input clock signal is performed by a p-channel metal oxide semiconductor field-effect-transistor (PMOSFET) 178 (of the phase detector 112, 114) that has its source terminal coupled to the input terminal 104 and its drain terminal coupled to a non-inverting input terminal of a comparator 190 of the phase detector 112, 114. The gate terminal of the PMOSFET 178 is coupled to the output terminal of the NAND gate 182.

The sampling of the output clock is provided by a PMOSFET 184 (of the phase detector 112, 114) that has its source terminal connected to the terminal 106, 122 and its drain terminal connected to the inverting input terminal of the comparator 190. The gate terminal of the PMOSFET 184 is coupled to the output terminal of the NAND gate 174. Not depicted in FIG. 4 are the corresponding parasitic capacitances present at the drain terminals of the PMOSFETs 178 and 184 that allow storage of the sampled clock signals. Thus, from the sample clock signals, the comparator 190 compares the sampled version to generate a signal indicative of the phase relationship of the clock signals. A latch 192 of the phase detector 112, 114 is driven by a periodic latch clock signal to latch the results of the comparison by the computer 190 and form (at its inverted output terminal) the associated bit in the phase detection register 132.

Figure 5:
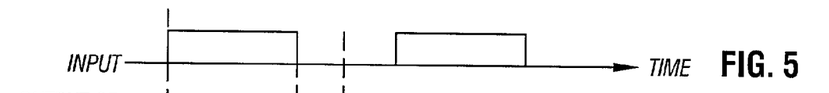
FIGS. 5, 6, 7 and 8 are waveforms depicting operation of the phase detector of FIG. 4 according to an embodiment of the invention.
Figures 6, 7:
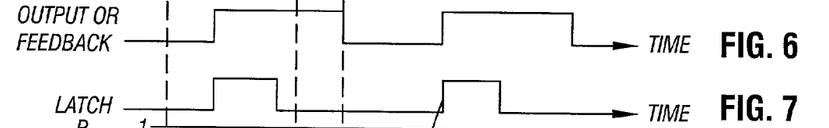
Figure 8:
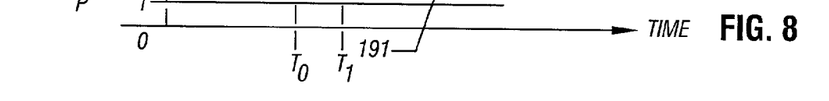

To further illustrate operation of the phase detector 112, 114 FIGS. 5, 6, 7 and 8 depict waveforms illustrating a scenario in which the output clock signal (see FIG. 6) leads the reference input clock signal (see FIG. 5). For this scenario, the output signal (called P (see FIG. 8)) of the latch 192 is set to a level indicative of a binary bit value of "1," indicating the lead condition. If, however, the output clock signal lags the input clock signal, then the P signal would indicate a binary bit value of "0." Thus, near time $T_0$, the PMOSFET 184 samples a bit value of "1" for the output/feedback clock signal, and near time $T_1$, the PMOSFET 178 samples a bit value of "0" for the input clock signal. In response to these sampled values, the comparator 190 drives its output signal low, and the latch 192 latches the level of the output signal of the comparator 190 via the pulse 191.

In some embodiments of the invention, the DLL circuit 14 may work in three operation modes: an initialization mode, a locking (otherwise called a "closed") mode and a frozen (otherwise called "open loop") mode. The initialization mode occurs during power up or reset of the system 10. During the initialization mode, the microprocessor 12 interacts with the interface 124 to set the delay of the delay line 100 to a relatively small value near the period of the input clock signal to prevent the DLL circuit 14 from locking onto harmonic frequencies.

Figure 9:
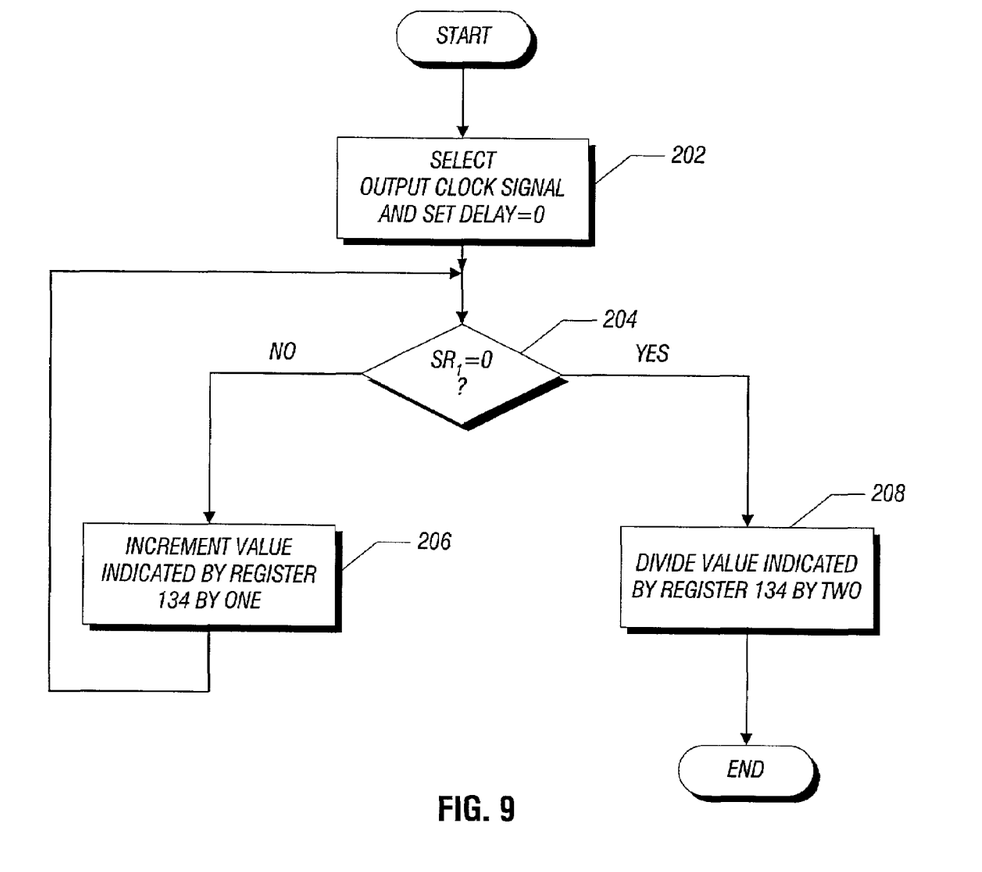
FIG. 9 is a flow diagram depicting control of the delay locked loop circuit in an initialization mode according to an embodiment of the invention.

As an example, FIG. 9 depicts a possible technique 200 that the microprocessor 12 uses during the initialization mode to control the DLL circuit 14. The microprocessor 12 may execute program code, for example, that is stored in the memory 16 to perform the technique 200.

Figure 10:
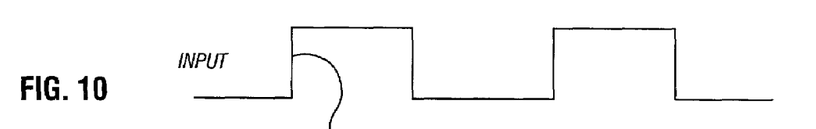
FIGS. 10, 11, 12 and 13 are waveforms of the delay locked loop circuit during the initialization mode according to an embodiment of the invention.
Figure 11:
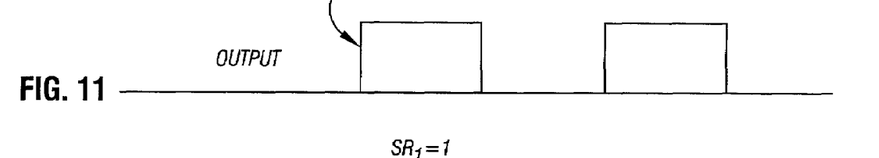
Figure 12:
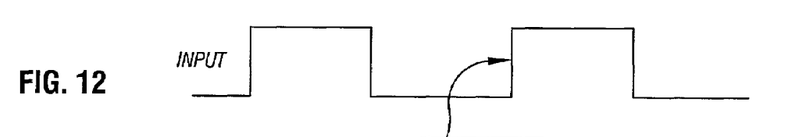
Figure 13:
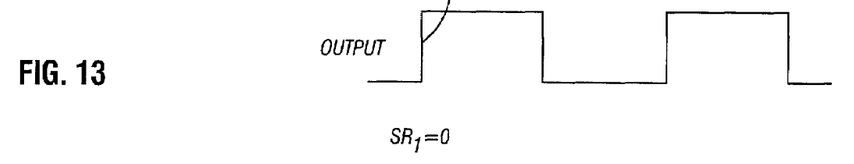

To aid in illustrating this technique 200, FIGS. 10 and 11 depict the scenario where the output clock signal initially leads the input clock signal, a condition in which the corresponding bit in the status register 132 indicates a "1" with a set to indicate a bit value of "1," and FIGS. 12 and 13 indicate a scenario where the output clock signal lags the input clock signal, a scenario where the corresponding bit value in the status register 132 indicates a "0."

Referring also to FIG. 9, in the technique 200, the microprocessor 12 first selects (block 202) the output clock signal formed from a predetermined part (one quarter, for example) of the delay line 100 by writing the appropriate value to the register 136. The microprocessor also sets (block 202) the delay of the delay line 100 near zero by writing the register 134 to clear the bits of the register 134. Next, the microprocessor 12 begins a software loop to increase the delay that is introduced by the delay line 100 until the output clock signal lags the input clock signal. In some embodiments of the invention, in this loop, the microprocessor 12 determines (diamond 204) whether the output clock signal is leading the input clock signal. If not, then the microprocessor 12 writes to the register 134 to increment (block 206) the delay of the delay line 100 by one and returns to diamond 204. Otherwise, the microprocessor 12 exits the loop to divide (block 208) the value stored in the register 134 by a multiple (two, for example) to reduce the delay so that the value stored in the register 134 is now approximately equal to the period of the input clock signal. After this event occurs, the initialization mode is complete, and the microprocessor 12 terminates the technique 200.

After the initialization mode is complete, the microprocessor 12 subsequently causes the DLL circuit 14 to enter the locking mode, a mode in which the DLL circuit 14 operates (under the control of the microprocessor 12) to keep the output clock signal synchronized to (i.e., to keep the phase different between the input and output clock signals near a predetermined phase difference) the input clock signal over time. In this manner, in the locking mode, the microprocessor 12 controls the DLL circuit 14 based on the bits that appear in the status register 132, bits that indicate the phase relationship between the input and output clock signals. For example, in this control, the microprocessor 12 performs a technique 250 (see FIG. 14) by executing program code 21 that may be stored in, for example, in the memory 20.

Figure 14:
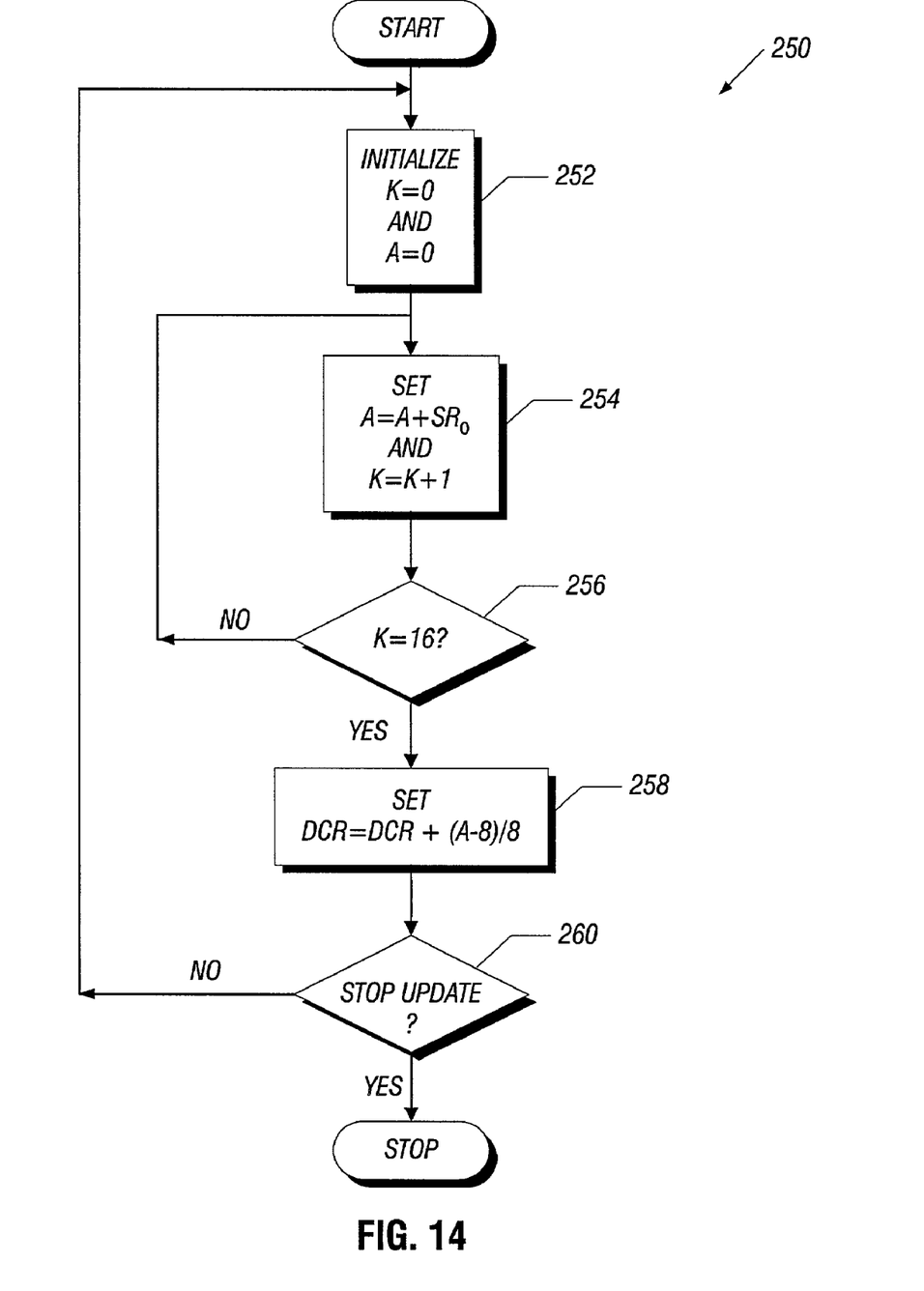
FIG. 14 is a flow diagram depicting a technique to control the delay locked loop circuit according to an embodiment of the invention.

In the technique 250, the microprocessor uses low pass filtering to update the value stored in the register 134 based on the phase detection results, results that are indicated by the bits in the register 132. As a more specific example of the technique 250, the microprocessor 12 may perform low pass software loops. In each loop, the microprocessor 12 averages a predefined number (sixteen, for example) of phase detection results by first initializing (block 202) certain processing variables, called "K" and "A" in this example. Next, the microprocessor 12 sets (block 254) the values of K and A by increasing the value represented by variable A by the value indicated by the bits of the status register 132 and incrementing K by one. The value "K" indicates the number of phase detector bit values (from the register 132) that are averaged. Therefore, when the microprocessor 12 determines (diamond 256) that K is equal to 16, then the microprocessor 12 proceeds to block 258. Otherwise, the microprocessor 12 returns back to block 254 to continue accumulating phase detector output bit values.

The microprocessor 12 uses the results of the sixteen phase detector output bit values to store a value in the register 134 that indicates a delay to produce the desired synchronization. For example, in some embodiments of the invention, the microprocessor (block 258) adds the value "(A−8)/8" to the value indicated by the register 134. Afterwards, the microprocessor 12 determines (diamond 260) whether to continue performing the low pass filtering. If so, then control returns to block 252. Otherwise, the microprocessor 12 terminates the technique 250.

As noted above, another mode of the DLL circuit 14, is the frozen mode, a mode in which the DLL circuit 14 operates in an open loop fashion. In this mode, the microprocessor 12 does not update the value stored in the register 134, and the DLL circuit 14 serves as a delay buffer. The advantage of this mode of operation is that the DLL circuit 14 may operate with lower noise and using less power, as compared to the locking mode, for example. Therefore, it is possible that, in some of the embodiments of the invention, the microprocessor 12 may alternate between the locking and frozen modes.

Referring back to FIG. 1, among the other features of the computer system 10, the clock generation circuit 22 may include, for example, an oscillator 24 that generates a clock signal that is provided to a frequency divider 26 that, in turn, provides various system clock signals at its various output terminals 28. The microprocessor 12 and the memory hub 16 may be coupled to a local bus 28. Besides providing an interface to the local bus 28, the memory hub 16 may provide an interface for an Accelerated Graphic Port (AGP) bus 32 and a Peripheral Component Interconnect (PCI) bus 30. The AGP is described in detail in the Accelerated Graphics Port Interface Specification, Revision 1.0, published on Jul. 31, 1996, by Intel Corporation of Santa Clara, Calif. The PCI Specification is available from The PCI Special Interest Group, Portland, Oreg. 97214. The memory hub 16 also provides an interface for a memory bus 38 through which the memory hub 16 communicates with the memory 20.

A network interface card (NIC) 40 may be coupled to the PCI bus 30 and form an interface for coupling the computer system 10 to a network 41, for example. A display driver 42 (of the computer system 10) may be coupled to the AGP bus 32 and form an interface to a display 43 of the system 10. The memory hub 16 may be coupled to a south bridge, or input/output (I/O) hub 48. The I/O hub 48 provides an interface for an I/O expansion bus 50 that may be coupled to an I/O controller 52, for example. The controller 52 may receive input from such devices as a keyboard 56 and a mouse 58. The controller 52 may also, for example, control operations of a floppy disk drive 54. Among these various interfaces, the I/O hub 48 may control operations of a hard disk drive 62 of the computer system as well as a CD-ROM drive 60 of the system 10.

In an embodiment of the invention, a system includes a locked loop circuit and a processor. The processor is coupled to the locked loop circuit to control the locked loop circuit and perform at least one other function in the system not related to the control of the locked loop circuit.

In an embodiment of the invention, a method includes providing a locked loop circuit that has a processor accessible interface. The method includes using a processor to control the locked loop circuit and perform at least one other function not related to the control of the locked loop circuit.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A system comprising:
   a locked loop circuit; and
   a processor coupled to the locked loop circuit to control the locked loop circuit to synchronize an input signal of the locked loop circuit to an output signal of the locked loop circuit and perform at least one other function in the system not related to the control of the locked loop circuit,
   wherein the control of the locked loop circuit by the processor includes the processor performing the following:
      reading a first value provided by an interface of the locked loop circuit indicative of a timing between the input signal and the output signal and the processor,
      based on the first value determining a second value indicative of a delay to be imposed by the locked loop circuit, and
      writing the second value to the interface of the locked loop circuit.

2. The system of claim 1, wherein the locked loop circuit comprises a delay locked loop circuit.

3. The system of claim 1, wherein the locked loop circuit comprises:
   an interface accessible by the processor.

4. The system of claim 3, wherein the interface indicates a phase difference between the input signal and the output signal.

5. The system of claim 3, wherein the system comprises a computer system having a system memory and the interface is addressable in a range of addresses used to access the system memory.

6. The system of claim 3, wherein the interface indicates storage accessible by the processor to store an indication of a delay used by the locked loop circuit.

7. The system of claim 3, wherein the interface includes storage accessible by the processor to store an indication of a selection of one or more of a plurality of output clock signals furnished by the locked loop circuit.

8. The system of claim 1, wherein the processor comprises a microprocessor.

9. The system of claim 1, further comprising:
   a system memory storing a program,
   wherein the processor executes the program to perform said other function.

10. A method comprising:
    providing a locked loop circuit having a processor accessible interface; and
    using a processor to control the locked loop circuit to synchronize an input signal of the locked loop circuit to an output signal of the locked loop circuit and perform at least one other function in the system not related to the control of the locked loop circuit.
    wherein the act of using the processor comprises using the processor to read a first value provided by the interface indicative of a timing between the input signal and the output signal, using the processor to determine based on the first value a second value indicative of a delay to be imposed by the locked loop circuit, and using the processor to write the second value to the interface.

11. The method of claim 10, wherein the locked loop circuit comprises a delay locked loop circuit.

12. The method of claim 10, further comprising:
    performing at least one of read and write operations to the interface to control the locked loop circuit.

13. The method of claim 10, further comprising:
    using the interface to indicate a phase difference between an input clock signal and an output clock signal generated by the locked loop circuit.

14. The method of claim 10, wherein the system comprises a computer system having a system memory and the interface is addressable in a range of addresses used to access the system memory.

15. The method of claim 10, further comprising:
    using the interface to store an indication of a delay used by the locked loop circuit.

16. The method of claim 10, further comprising:
    using the interface to store an indication of a selection of one or more of a plurality of output clock signals furnished by the locked loop circuit.

17. The method of claim 10, wherein the processor comprises a microprocessor.

18. An article comprising a computer accessible storage medium storing instructions to, when executed, cause a processor to:
    read a first value provided by an interface of a locked loop circuit indicative of a timing between an input signal and an output signal, determine based on the first value, a second value indicative of a delay to be imposed by the locked loop circuit, and write the second value to the interface, wherein the processor performs at least one function not related to the control of the locked loop circuit.

19. The article of claim 17, wherein the locked loop circuit comprises a delay locked loop circuit.

20. The article of claim 18 the storage medium storing instructions to cause the processor to use an interface to receive the indication of the phase difference.

21. The article of claim 18, the storage medium storing instructions to cause the processor to store an indication of a delay used by the locked loop circuit in an interface of the locked loop circuit.

22. The article of claim 18, the storage medium storing instructions to access an interface of the locked loop circuit to store an indication of a selection of one or more of a plurality of output clock signals furnished by the locked loop circuit.

23. The system of claim 1, wherein the delay locked loop circuit comprises a delay chain to establish a delay between the input signal and the output signal, and the processor controls the delay chain based on the indicated timing between the input signal and the output signal.

* * * * *